United States Patent
Myerson et al.

(10) Patent No.: US 7,329,319 B2
(45) Date of Patent: Feb. 12, 2008

(54) METHOD FOR PRODUCING CRYSTALS AND SCREENING CRYSTALLIZATION CONDITIONS

(75) Inventors: Allan S. Myerson, Chicago, IL (US); Alfred Y. Lee, Chicago, IL (US)

(73) Assignee: Illinois Institute of Technology, Chicago, IL (US)

( * ) Notice: Subject to any disclaimer, the term of this patent is extended or adjusted under 35 U.S.C. 154(b) by 338 days.

(21) Appl. No.: 10/985,307

(22) Filed: Nov. 10, 2004

(65) Prior Publication Data

US 2006/0096523 A1    May 11, 2006

(51) Int. Cl.
*C30B 7/02*    (2006.01)

(52) U.S. Cl. .............................. 117/68; 117/937; 117/70

(58) Field of Classification Search .................. 117/73, 117/937, 68, 70
See application file for complete search history.

(56) References Cited

U.S. PATENT DOCUMENTS

| | | | | |
|---|---|---|---|---|
| 3,746,908 A | * | 7/1973 | Engeler | ........................ 315/10 |
| 5,130,103 A | * | 7/1992 | Yamagata et al. | ........... 428/209 |
| 5,403,772 A | * | 4/1995 | Zhang et al. | ................ 438/166 |
| 5,635,420 A | * | 6/1997 | Nishioka | ......................... 438/3 |
| 5,846,320 A | * | 12/1998 | Matsuyama et al. | ........... 117/90 |
| 5,854,096 A | * | 12/1998 | Ohtani et al. | ................ 438/166 |
| 6,605,535 B1 | * | 8/2003 | Lee et al. | .................... 438/684 |
| 6,645,293 B2 | | 11/2003 | Myerson | |
| 7,115,900 B2 | * | 10/2006 | Aizenberg et al. | ............. 257/40 |
| 2006/0096523 A1 | * | 5/2006 | Myerson et al. | ............... 117/68 |
| 2006/0213425 A1 | * | 9/2006 | Myerson et al. | ............... 117/68 |

FOREIGN PATENT DOCUMENTS

KR    2005118565 A  *  12/2005

\* cited by examiner

*Primary Examiner*—M. Wilczewski
(74) *Attorney, Agent, or Firm*—Laurence P. Colton; Smith, Gambrell & Russell

(57) ABSTRACT

A method for producing crystals and for screening crystallization conditions of chemical materials on distinct metallic islands with specific functional groups, for preparing and screening the conditions necessary to promote a specific polymorph of a crystal, and a means for testing and screening the more precise conditions suitable for achieving a desired size or form of a crystal.

24 Claims, 5 Drawing Sheets

FIG. 1
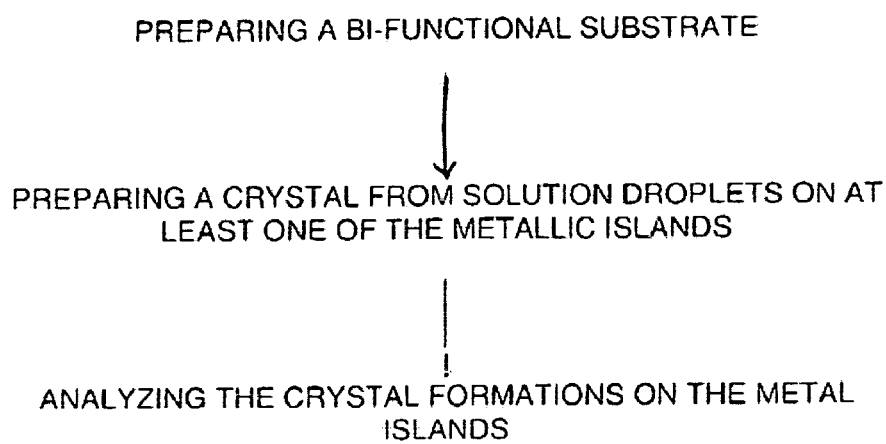
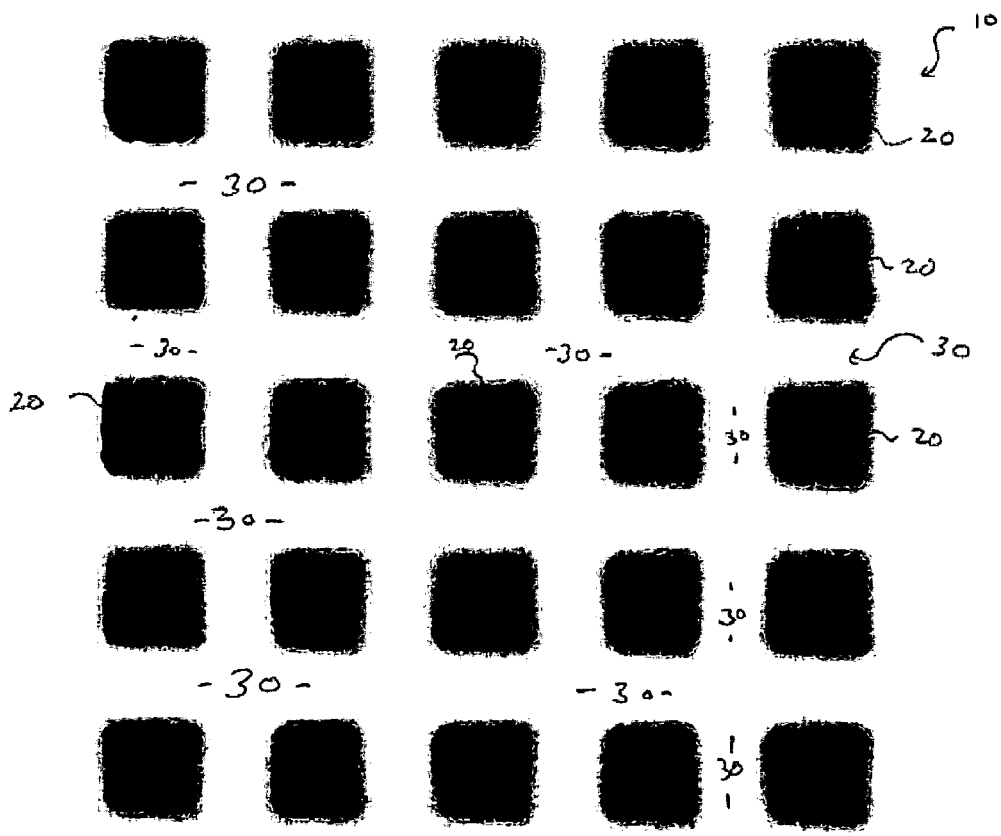
FIG. 2

Single Glycine Crystals on
130 μm Gold islands

Single Glycine Crystals on
30 μm Gold islands

Mefenamic Acid Crystals (35 μm) Formed
on 95 μm Gold Islands (Concentration: 0.5 g per 20 g of solvent)

Mefenamic Acid Crystals Formed on 50 μm
Gold Islands (Concentration: 0.75 g per 20 g of solvent)

METHOD FOR PRODUCING CRYSTALS AND SCREENING CRYSTALLIZATION CONDITIONS

BACKGROUND OF THE INVENTION

1. Technical Field

This invention relates generally to a method for producing crystals of a desired size and form and a process for screening the crystals and the crystallization conditions. More particularly, this invention relates to a method in which a large number of crystals of a desired size and form can be produced quickly and reproducibly for use in the testing and screening of crystallization conditions, such as the production of crystals in metastable states and the screening of the crystals for different polymorphic forms.

2. Prior Art

Specific conditions are necessary to crystallize chemical materials with a specific polymorph crystal form and size. Such conditions include the pH, temperature, ionic strength, and specific concentrations of salts, organic additives, detergents, and impurities in the solution. As different condition may allow the generation of different forms and sizes of the crystals, it is often difficult to achieve or obtain the specific condition for crystallizing a crystal with a specific form and size. As such, it is often useful to screen and test conditions that may potentially be suitable for crystal growth.

Crystallization from solution is an important separation and purification process in the chemical process industries. It is a primary method for the production of a wide variety of materials ranging from inorganic compounds to high value-added materials. In addition to product purity, crystallization must also produce particles of the desired size and shape, as well as particles of the desired polymorph.

Chemical species have the ability to crystallize into more than one distinct structure. This ability is called polymorphism (or, if the species is an element, allotropism). Different polymorphs of the same material can display significant changes in their properties, as well as in their structures. These properties include density, shape, vapor pressure, solubility, dissolution rate, bioavailability, and electrical conductivity. Polymorphism is quite common among the elements and also in inorganic and organic species. It is especially prevalent in organic molecular crystals, which often possess multiple polymorphs. The incidence of polymorphism in organic molecular crystals bears great significance to the pharmaceutical, dye, agricultural, chemical, and explosives industries.

Under a given set of conditions, one polymorph exists as the thermodynamically stable form. This is not to say, however, that the other polymorphs cannot exist or form in these conditions. It means only that one polymorph is stable while the other polymorphs can transform to the stable form. For example, acetaminophen can exist in two forms. The thermodynamically stable phase has a monoclinic form of space group P21/n. A second, less stable phase can be obtained; this phase is orthorhombic (space group Pbca) and has a higher density indicative of a closer packing of the molecules.

Often, particularly in solution systems, the polymorph in the metastable state (a β-polymorph, for example) will convert to the polymorph in the stable state (an α-polymorph, for example). However, the β-polymorph may have the more interesting, or at least other interesting, properties. In pharmaceutical product development, the most stable polymorph has, generally, been selected for employment in the final dosage product. Yet metastable forms have often been utilized due to their enhanced dissolution and/or bioavailability. In these cases, an understanding of the stability of these metastable forms under processing and storage conditions has proven crucial for the safety and efficacy of the drug. The United States Food and Drug Administration regulates both the drug substance and the polymorph for all crystalline pharmaceuticals and requires extensive studies of polymorph stability.

To develop the optimal delivery method for a particular drug in the pharmaceutical industry, there exist two very important factors. These include the control of particle (crystal) size and shape and the production of the correct polymorph. In recent years, an increased interest in new drug delivery systems has developed, turning attention to direct injection (intravenous) methods and inhalation. These methods necessitate precise control of particle size, shape, and polymorph produced. Direct inhalation requires particles in the 1-3 micron range while direct injection requires particles in the 100-500 nanometer range.

Many different techniques are employed for particle size reduction, such as supercritical fluid crystallization, impinging jet crystallization, milling, and spray drying. However, each technique has its drawback. For instance, milling requires heat and, as a result, the solid may thermally degrade. Spray drying, supercritical fluid based crystallization, and other crystallization-based methods are contingent on the creation of a very high supersaturation, thus favoring particle nucleation over growth. While effective in making small particles, high supersaturation often results in amorphous materials or an undesired polymorph, rather than the desired form of the crystalline compound. This is particularly true in the case of organic molecular crystals, in which the forces holding the molecules together in the lattice prove relatively weak.

Crystallization from solution generally begins with the nucleation of crystals followed by the growth of these nuclei to finite size. Nucleation and growth follow separate kinetic regimes with nucleation normally being favored at high driving forces (supersaturation) and growth being favored at low supersaturations. Since the ratio of the rate of nucleation to growth during a crystallization process determines the crystal size distribution obtained, this means that high supersaturations are normally employed to produce small crystals. In attempting to produce crystals in the 105 micron range and crystals below 1 micron, this has led to the use of methods that produce very large supersaturations such as supercritical fluid crystallization and crystallization from an impinging jet. Both of these methods suffer from significant problems. One problem is that substances that form organic molecular crystals can be difficult to nucleate under high supersaturations and often produce amorphous material instead of the desired crystals. Another problem is that these methods are difficult to control, design and scale-up and have had little commercial success. A third problem is that these methods can produce an undesired polymorph because of the high levels of supersaturation used.

Organic monolayer films have been used as an interface across which geometric matching and interactions, such as van der Waals forces and hydrogen bonding, can transfer order and symmetry from the monolayer surface to a growing crystal. Nucleation and growth of organic crystals, nucleation rates, polymorphic selectivity, patterning of crystal, crystal morphology, and orientation (with respect to the surface) can undergo modification through site-directed nucleation. This can be achieved using supramolecular assemblies of organic molecules, such as chemically and spatially specific surfaces. Compressed at the plane of water/air interface, Langmuir monolayers are mobilized by, and commensurate with, the adsorption of aggregates during crystallization.

Self-assembled monolayers (SAMs) are single layers of ordered molecules adsorbed on a substrate due to bonding between the surface and molecular head group. SAMs are molecular units that are spontaneously formed upon certain substrates, such as gold and silicon, when immersed in an organic solvent. One of the better known methods to form SAMs is when alkanethiol molecules chemisorb on gold surfaces through the thiol head group to reproducibly form densely packed, robust, often crystalline monolayer films. The surface chemical and physical properties of the monolayer films can be controlled precisely by varying the terminal chemical functionality of the alkanethiol molecule.

SAMs and mixed SAMs lack the mobility of molecules at an air-water interface and, hence, lack the ability to adjust lateral positions to match a face of a nucleating crystal. This is especially true for SAMs of rigid thiols, for which even conformational adjustment is not possible. SAMs of 4-mercaptobiphenyls are superior to those of alkanethiolates in providing stable model surfaces, as well as in the ability to engineer surface dipole moments. Coupled with the ability to engineer surface functionalities at the molecular level, SAMs and mixed SAMs of rigid thiol offer unique surfaces for nucleation and growth of inorganic and organic crystals.

Silane SAMs have been used to promote heterogeneous nucleation and growth of iron hydroxide crystals and to study the effect of surface chemistry on calcite nucleation, attachment, and growth. For example, $CaCO_3$ has been crystallized on surfaces of alkanethiolate SAMs on gold and SAMs of functionalized alkanethiols can control the oriented growth of calcite. Also, The heterogeneous nucleation and growth of malonic acid ($HOOCCH_2COOH$) has occurred on surfaces of alkanethiolate SAMs on gold that terminated with carboxylic acid and with methyl groups. However, while SAMs have been used to grow crystals, specifically patterned SAMs have not been used to limit the dimensions and sizes of crystals, or to grow distinct crystal of selected dimensions and sizes.

U.S. Pat. No. 6,645,293 to Allan S. Myerson discloses methods for the crystallization of nano-size crystals of molecular organic compounds while operating at a low supersaturation. The methods are based on controlling the domain size available during the crystallization process. In one method, microcontacted printed self-assembled monolayers (SAMs) with local domain area sizes ranging from 25 $\mu m^2$ to 2500 $\mu m^2$ and fabricated SAMs generated from electron beam lithography, are employed to control the size, orientation, phase, and morphology of the crystal. In another method, a continuous micro-crystallizer having a vessel diameter of 25 microns or less is used to ensure that that the maximum size of the crystals in two dimensions is constrained by the vessel itself. Both methods allow control of supersaturation and growth conditions, as well as manageability over crystallinity and polymorphism, and each method's domain size has the potential for further reduction.

Although there are methods for initiating crystallization (including nucleation rates) and growing crystals (including affecting the polymorphic selectivity, patterning of crystal, crystal morphology, and orientation of the crystals), there is a need for screening and characterizing the crystals produced, for further research on the crystals and for producing crystals of a desired morphology, polymorphic form and stability, among other characteristics. Therefore, it can be seen that there is a need for a method for producing crystals of both a desired structure and a desired size under modest supersaturation conditions in conjunction with a method for screening the crystals for characteristics such as morphology, polymorphic form and stability.

BRIEF SUMMARY OF THE INVENTION

Briefly, this invention is a method for preparing crystals on distinct metallic islands with specific functional groups and then using the metallic islands to screen the crystallization conditions. This invention may be used also to prepare and screen the conditions necessary to promote a specific polymorph of a crystal. Additionally, as the crystal formation proceeds on the defined metallic islands, it is possible to achieve high throughput and controlled crystal formation due to, for example, the pre-selected size of the metallic islands and the structure of the metallic islands. While the general conditions required to grow many crystals are known, this invention also provides a means to test and screen the more precise conditions suitable for achieving a desired size or form of a crystal.

In a preferred embodiment, this invention takes advantage of the surface chemistry of self-assembled monolayers (SAMs) to improve crystal formation. More particularly, SAMs are deposited on patterned substrates having metallic islands exhibiting lyphophilic (or hydrophilic) properties and are surrounded by a lyophobic (or hydrophobic) region. Lyophilic (or hydrophilic) SAMs can be designed by employing thiol surfactants where the chemical functional head group includes, for example, carboxy (—COOH), hydroxyl (—OH), nitro (—$NO_2$), sulfonic acid (—$SO_3^-$), and phosphonic acid (—$PO_4^-$) functional groups. By depositing SAMs on the substrate, it is possible to create functionalized metallic islands and ensure that crystal formation occurs on the metallic islands.

More particularly, nucleation and growth of the crystals occurs exclusively on the functionalized metallic islands. Solution droplets having a defined size and shape are formed on the metallic islands when the patterned surface of the metallic island is immersed and slowly withdrawn from an unsaturated, saturated or supersaturated solution. Preferably, the SAMs and functional group is selected to create a preferential bond between the metallic island and the solution droplets. Preferably, the droplet becomes a supersaturated solution, which is more optimal for crystal growth. Supersaturation can be accomplished by any of the known methods, such as evaporation, antisolvent addition, vapor diffusion, heating and cooling, and the like.

The preparation of crystal samples is accomplished in a micro-scale, high throughput manner. More particularly, this method for preparing crystals comprises the steps of:

(1) preparing a bifunctional substrate with metallic islands and multiple layers of self-assembled monolayers (SAMs) having desired chemical functional groups; and (2) preparing a crystal from solution droplets on the metallic islands on the substrate. Preferably, the metallic islands are prepared so that solution droplets preferentially wet the metallic islands.

One illustrative method for preparing a bifunctional substrate comprises the steps of:

(1) depositing a metal layer onto a surface of a substrate so to create metallic islands of the deposited metal;

(2) depositing a first layer of self-assembled monolayer (SAMs) with a desired chemical head group onto the metallic islands; and (3) depositing a second layer of SAMs with another chemical functional group for use as backfill substrate onto the metallic islands.

The metal layer may be deposited onto a substrate (such as glass or silicon wafer) using a metal evaporation process. Generally, a metal adlayer such as titanium and chromium is first deposited onto the substrate to promote adhesion between the metal layer and substrate. Metals suitable for use as the metal layer include gold, silver titanium, platinum, nickel, copper, palladium and combinations thereof. Preferably, the metal layer is gold and the adlayer is titanium, which are deposited onto the substrate using an electron beam evaporator. Such methods for depositing the metal layer onto the substrate may incorporate the use of a mesh or a photoresist polymer.

Once the metallic islands have been revealed on the substrate, a multiple layer pattern is deposited on the substrate by subsequent immersions in surfactant materials. The substrate is first immersed into the first surfactant material so to create a homogeneous self-assembled monolayer with a specific chemical functional head group formed on the metallic islands. Subsequently, the substrate is soaked in a second surfactant material so to provide back fill-in for the metallic islands. Preferably, the first surfactant preferentially binds to the metallic islands of the substrate.

A crystal is prepared on the metallic islands from solution droplets under a set of defined parameters. As the parameters influence the size and form of control formation, it is possible to determine the condition for growing a crystal of a desired size and form by testing various parameters. For example, the size of the metallic island, the structure of the metallic island, and the solution concentration all can affect the size of the resultant crystal. That is, the conditions for crystallization may be selected to promote a specific form or size (or range of sizes) of crystal. While the crystal size is in part controlled by the size of the droplet and the size of the metallic islands, the crystal form may be controlled by varying the rate of evaporation (or other supersaturation technique such as antisolvent addition, vapor diffusion, heating and cooling, and the like), the incubation temperature, the concentration of droplet solution, and the chemical functionality of the SAMs. By modifying the characteristics of the droplet, it is possible to obtain a crystal of a desired form and size.

One illustrative method for depositing solution droplets upon the metallic islands is by immersion of the substrate into a crystallite solution. Specifically, droplets of the crystallite solution are placed on the metallic islands of the substrate by immersing and soaking the bifunctional substrate in the crystallite solution. Subsequently, the substrate is slowly withdrawn from the solution such that the solution droplets wet the metallic islands. The solution drops with defined size and shapes are formed on the metallic islands when the patterned surface is immersed and slowly withdrawn from the solution. Preferably, the droplet solution contains both seeds (crystallized material) and solvent so to improve crystallization rates. The droplets formed on the metallic islands will eventually crystallize.

After the crystals have formed on the metallic islands, the crystals now may be analyzed with or without the removal of the crystals from the substrate, which greatly simplifies the screening of the crystals. The size, morphology, and crystal form may be identified or analyzed by optical, electronic, and Raman microscopy. Other analytic techniques such as single crystal and powder x-ray diffraction, particle analyzers, and thermal analysis may be used to identify the crystalline forms on the metallic islands as well. The ability to screen the crystals in this manner greatly increases the efficiency of the screening process in that depending on the metallic island size, hundreds to tens of thousands or more metallic islands can be contained in a relatively small area and thus hundreds to tens of thousands or more crystals can be produced in this relatively small area.

In use and application, this invention provides a means to test and screen crystallization conditions for crystals with desired sizes and forms. The use of the patterned metallic islands provide a quick, reliable, consistent method to provide picoliter volumes or smaller solution droplets for the generation of supersaturated solutions, eventually resulting in the patterned crystallization of the solute with controlled size and form. As such, this invention provides a method to prepare crystals and screen crystallization conditions in a high-throughput manner.

These features, and other features and advantages of the present invention, will become more apparent to those of ordinary skill in the relevant art when the following detailed description of the preferred embodiments is read in conjunction with the appended drawings in which like reference numerals represent like components throughout the several views.

BRIEF DESCRIPTION OF THE FIGURES

FIG. 1 is flow chart depicting one illustrative embodiment of the present invention.

FIG. 2 is a drawing of a substrate showing patterned metallic islands formed using a mesh.

DETAILED DESCRIPTION OF THE PREFERRED EMBODIMENTS

Figure 3:
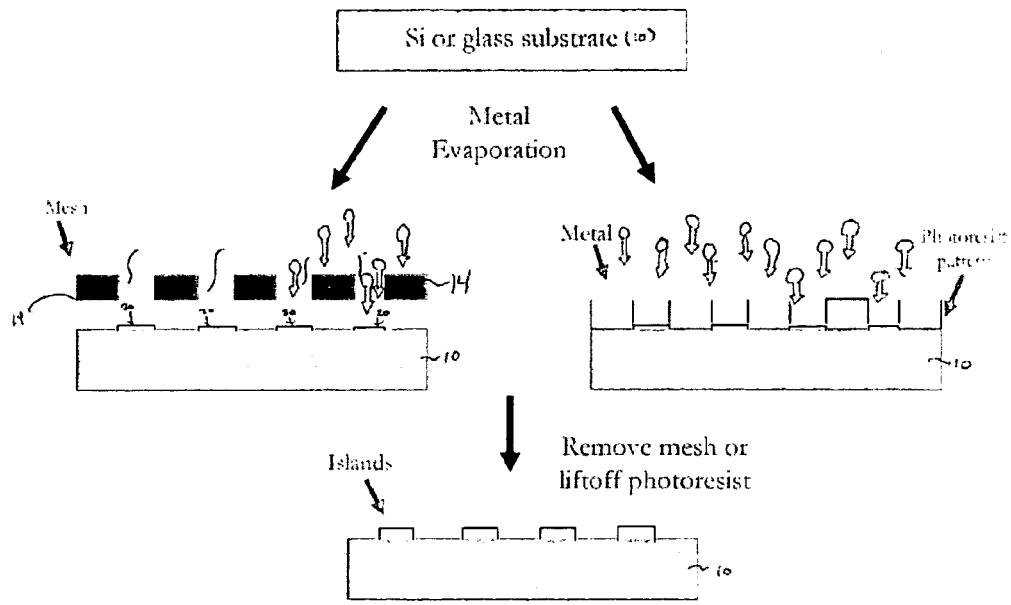
FIG. 3 is a schematic illustrating methods for forming of patterned metallic islands on a substrate.

Preferred embodiments of the present invention are methods for preparing crystals and screening crystallization of chemical materials on distinct metallic islands. Preferably, such embodiments may be used to prepare and screen the conditions necessary to promote a specific polymorph of a crystal of a specific size. As the crystal formation occurs on the distinct metallic islands, and a large number of the distinct metallic islands can be contained in a relatively small area, it is possible to achieve high throughput conditions and controlled crystal formation. While this invention is described herein in conjunction with the preferred embodiments, it will be understood that the invention is not limited to these embodiments.

While the general conditions required to grow many crystals are known, this invention provides a means to test and screen the more precise conditions suitable for achieving a desired size or form of a crystal. More particularly, an embodiment provides a means to test and screen particular conditions for achieving a desired size or form of a crystal. For example, this embodiment may be used to test and screen the conditions to crystallize specific polymorphs, which exhibit different chemical and physical properties (e.g. solubility, dissolution and bioavailability), for use in the pharmaceutical field. This method enables the solutions to crystallize under a variety of conditions in a quick and reliable manner so to capture the diversity of the crystals.

Further, this invention takes advantage of the surface chemistry of self-assembled monolayers (SAMs) to improve crystal formation. More particularly, SAMs are deposited on patterned substrates having metallic islands exhibiting lyphophilic (or hydrophilic) properties and are surrounded by a lyophobic (or hydrophobic) region. Lyophilic (or hydrophilic) SAMs can be designed by employing thiol surfactants where the chemical functional head group includes, for example, carboxy (—COOH), hydroxyl (—OH), nitro (—$NO_2$), sulfonic acid (—$SO_3^-$), and phosphonic acid (—$PO_4^-$) functional groups. By depositing SAMs on the substrate, it is possible to create functionalized metallic islands and ensure that crystal formation occurs on the metallic islands. As disclosed in more detail below, a large number of SAMs can be deposited in a relatively small area and the size of the SAMs can be varied so as to be able to provide a significant number of sites for crystal formation and growth and to allow for the crystallization and growth of various sizes and forms of crystals.

Nucleation and growth of the crystals occurs exclusively on the functionalized metallic islands. Solution droplets having a defined size and shape and are formed on the metallic islands when the patterned surface is immersed and slowly withdrawn from an unsaturated, saturated or supersaturated solution. Preferably, the SAMs and functional groups are selected to create a preferential bond between the metallic island and the solution droplets. Preferably, the solution droplet becomes supersaturated solution, which is more optimal for crystal growth. Specifically, the droplet solution remains on the surface of the metallic islands.

This invention also comprises a new method for making distinct metallic islands for the nucleation and growth of crystals for screening purposes. Generally, the crystals are grown on the distinct metallic islands and then screened in situ to characterize the crystals as to form, and specifically polymorphic form. Droplets of solution containing the materials or compounds of interest are placed on the distinct metallic islands via various methods, such as the immersion method mentioned previously and disclosed in more detail below. The solution achieves supersaturation (low, modest or high, depending on the specific circumstances) via known techniques, such as, for illustrative purpose only, evaporation, vapor diffusion, antisolvent diffusion oil diffusion, and heating and cooling techniques. The crystallization and supersaturation conditions are controlled, which allows the control of the crystal forms. Once the crystals are formed, the crystals can be characterized or otherwise screened by known techniques, such as Raman microscopy. Effectively, the present invention is a highly efficient method of screening crystals using the small distinct metallic islands.

Further, in terms of polymorph screening, the bulk solution from which the solution droplets emanate may contain various forms of a crystal, such as a stable α-polymorph and a metastable β-polymorph. Metastable forms have a tendency to change quickly to the more stable form. Thus, in prior crystallization techniques, the resulting crystals formed from the solution phase tended to be of the more stable polymorph. In the present invention, the crystals are not grown directly in the liquid phase, but are grown on a solid, namely, the distinct metallic islands. As a result, crystals of the metastable polymorph can grow on the distinct metallic islands, resulting in the production of more and better metastable (or other) polymorphs. The growth of the crystals on the solid metallic islands helps to prevent the conversion of the metastable crystals to the more stable crystals as solid state conversion is less likely to occur than liquid state conversion.

SAM Techniques

An illustrative example of a crystallization domain of controlled size and geometry is a self-assembled monolayer (SAM) with local domain area sizes selected to result in a crystal having the desired dimensions. In SAM techniques, the crystallization domain comprises microcontacted printed self-assembled monolayers (SAMs) with local domain area sizes as small as 15 $\mu m^2$ and fabricated SAMs generated from electron beam (e-beam) lithography. These SAMs are employed to control the size, orientation, phase, and morphology of the crystal. Functionalized SAMs can serve as heterogeneous nucleants and promote the nucleation of organic, inorganic, and protein crystals.

Patterning using SAMs is known and has attracted growing attention due to its potential applications in sensor design, microelectronic devices, in addition to many other uses. To date, structures of various SAMs on gold, with a characteristic scale of 0.1-100 μm, have been generated using microcontact printing, micromachining, focused ion beam writing, photolithography/lift off, and microwriting. Of these techniques, the most versatile is microcontact printing. Many of these SAM techniques can be found in U.S. Pat. No. 6,645,293 and in other publicly available literature and is known to those of ordinary skill in the art.

In the present invention it has been found that the distinct metallic islands created using SAMs techniques can be varied in size. Islands having a square configuration tend to be the preferred shape as such configurations are relatively simple to construct on a substrate and rectangular arrays of samples, such as the array of a number of square islands, are a norm for characterization equipment. The preferred islands have sides in the sub-1000 micron range, with the size of the islands being selected to balance the desired crystal size with the desired numbers of crystals or crystal characterization throughput. Specifically, smaller crystals can be grown on smaller islands while lager crystals can be grown on larger islands, and smaller islands allow for a higher island density (more islands per substrate area while larger islands allow for a lower island density (fewer islands per substrate area). As disclosed in more detail below, 200 islands having a side of 725 microns can be contained on the same are as 80,000 islands having a side of 30 microns. Similarly, 200-290 micron crystals can be grown on 725 micron islands while 5-10 micron crystals can be grown on 30 micron islands.

Crystal Production Methods

Referring now to FIG. 1, an embodiment of this invention is a method for the preparation of crystal samples in a micron-scale, high throughput manner. This method for preparing crystals comprises the steps of:

(1) preparing a bifunctional substrate with metallic islands and multiple layers of self-assembled monolayers (SAMs) having desired chemical functional groups; and (2) preparing a crystal from solution droplets on the metallic islands on the substrate.

1. Preparing a Bifunctional Substrate

The substrate 10, as shown in FIG. 2, is prepared using SAM techniques so that it has bifunctional metallic islands 20. The substrate 10 (such as a glass slide or silicon wafer) is prepared either so that the metallic islands 20 are lyophilic and the backfill 30 is lyophobic or so that it has metallic islands 20 are hydrophilic and the backfill 30 is hydrophobic. The metallic islands 20 provide the location where crystals ultimately will be grown and the differences in material of the backfill 30 and the metallic islands 20 help to ensure that the crystal grows on the metallic island 20.

One method for preparing a bifunctional substrate comprises the steps of:

(1) depositing a metal layer onto a surface of a substrate so to create metallic islands of the deposited metal;

(2) depositing a first layer of self-assembled monolayer (SAMs) having desired chemical head group onto the metallic islands; and (3) depositing a second layer of SAMs having another chemical functional group on the substrate that acts as a backfill for with respect to the metallic islands.

Referring now to FIG. 3, a metal layer 13 may be deposited first onto a substrate 10 using a metal evaporation process. Such evaporation processes are able to deposit the metal onto the substrate 10 and a metal adlayer is usually employed to promote adhesion between the substrate 10 and any future metal layers. Metals suitable for use as the metal layer 13 include gold, silver, palladium, copper, platinum, nickel, and combinations thereof, while the metal adlayer include titanium and chromium. Preferably, the metal layer 13 is gold and the adlayer is titanium, which may be deposited onto the substrate using an electron beam evaporator. Such methods for depositing the metal layer 13 onto the substrate 10 may incorporate the use of a mesh 14 or a photoresist 16 polymer and are known or readily determinable by those with ordinary skill in the art.

More particularly, depositing the metal layer on the substrate 10 may be accomplished using a mesh 14. Using this mesh method, the metal layer is applied across mesh so to create a distinct and defined pattern of metallic islands 20. As the metal is deposited on the substrate only through the open sections 14A of the mesh 14, the size and shape of the pattern of the metallic islands 20 are determined by the open sections 14A and pattern of the mesh. After the mesh has been removed from the substrate, a pattern of metallic islands is revealed on the substrate. Preferably, the mesh 14 has open sections ranging from 3 microns to 1000 microns and has a relatively uniform pattern. The size and shape of the metal islands may be controlled by controlling the pattern of the mesh 14.

Alternatively, depositing the metal of the substrate may be accomplished using a photoresist polymer 16. Since a photoresist polymer 16 becomes insoluble when exposed to ultraviolet light, a pattern is placed over the substrate and exposed to ultraviolet light. After exposure to the ultraviolet light, the photoresist pattern 16 is lifted off or is removed by dissolving the surface using an organic solvent such as acetone. Specifically, the size and pattern of the islands is dictated by the photoresist pattern that is formed on the substrate. Again, the size and shape of the metallic islands may be controlled by the photoresist pattern.

Figure 4:
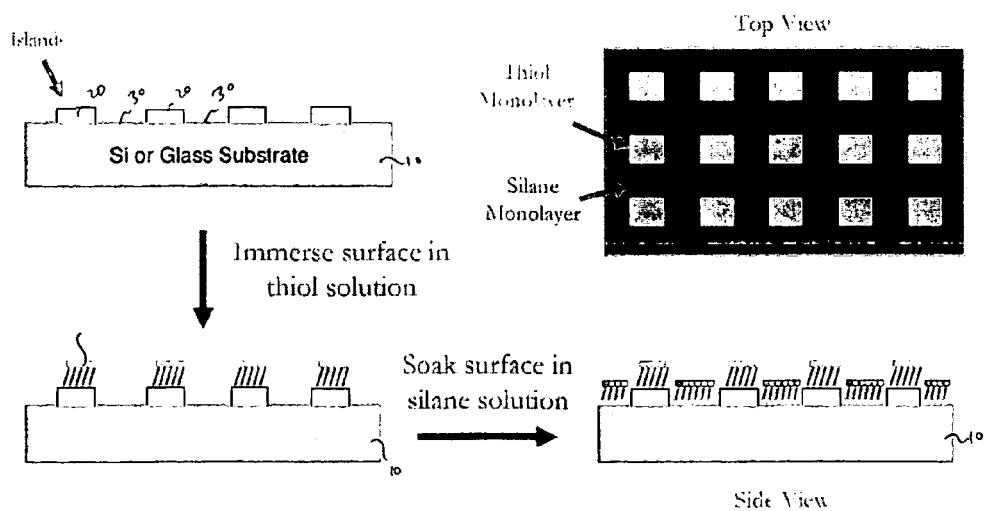
FIG. 4 is a schematic illustrating method for depositing monolayers on the substrate.

Referring now to FIG. 4, once the metallic islands have been revealed on the substrate 10, a multiple layer pattern is deposited on the substrate 10 by subsequent immersions. As shown from a side view, the substrate 10 is first immersed into the first surfactant material 22 so to create a homogeneous self-assembled monolayer with a specific chemical functional head group formed on the metallic islands 20. Subsequently, the substrate 10 is soaked in a second surfactant material 32 so to provide back fill-in 30 for the metallic islands 20.

Referring now to FIG. 3, the deposition of the second layer on the substrate results in a pattern of the metallic islands on the substrate 10 with a defined uniform pattern of metallic islands 20 and backfill 30. The first monolayer is primarily bound to the metallic islands 20 and the second layer primarily binds to the substrate as backfill 30. As each layered material contain functional head groups, it is possible to provide a background substrate in which crystallite droplets may be tested against. Ultimately, a solution droplet will be deposited on the metallic island 20 and the crystal will be prepared on the metallic islands 20.

The first surfactant material 22 forms a monolayer on the metallic islands 20 of the substrate 10. Such a surfactant material includes thiols that are preferentially able to bind to the metallic islands 20. Preferably, the first surfactant material has desired chemical head groups selected from the group comprising carboxy (—COOH), hydroxyl (—OH), nitro (—$NO_2$), sulfonic acid (—$SO_3^-$), and phosphonic acid (—$PO_4^-$) functional groups. One of ordinary skill in the art may select a surfactant material so to optimize the bond between the monolayer and the metallic islands 20 and to place a desired functional group on the metallic islands 20 that is able to maximize the adhesion to the solution droplet.

The second surfactant material 32 is deposited as monolayer adhered between the metallic islands 20. Preferably, the second surfactant material preferentially binds to substrate 10 over the metallic islands 20. The chemical functionality of the second surfactant is used to back fill the substrate, which creates a bi-functional surface on the substrate. The second surfactant material preferably is a surfactant that contains silanes. While the second material may have the chemical head groups similar to that the first surfactant material, preferably the chemical head group of the second surfactant material 32 is different from that of the first surfactant material 22. Preferably, the second surfactant material 32 is selected so that is does not form a strong bond with a solution droplet. One of ordinary skill in the art may select a surfactant material so to optimize the bond between the monolayer and the substrate 10 and to place a desired functional group on the metallic islands.

As shown, when the surfactant first material 22 and the second surfactant material 32 have been applied to the substrate 10, an alternating pattern of material is formed. Specifically, the metallic islands 20 have a monolayer of surfactant material and the backfill 30 has a monolayer of the second surfactant material. As will be seen, the crystal will be prepared on the metallic islands 20 from solution droplets.

The size of the metallic islands and the density of the metallic islands on the substrate can be selected based on the size of the crystal desired, the number of crystals desired, or a balancing of these two factors. Specifically, for larger crystals, larger islands are preferred (resulting in a lower island density on the substrate and a lower average throughput) and for higher throughputs, smaller islands are preferred (resulting in a higher island density on the substrate and smaller crystals). Those of ordinary skill in the art can produce islands of a desired size without undue experimentation.

2. Preparing a Crystal from Solution Droplets

A crystal is prepared on at least one of the metallic islands from solution droplets under a set of defined parameters. As the parameters influence the size and form of crystal formation, it is possible to determine the particular conditions for growing a crystal of a desired size and form by testing various parameters.

Specifically, the multilayer substrate provides a background in which droplets of droplet solution may be tested for its ability to crystallize. Solution droplets of various concentrations can be deposited on the metallic islands for crystallization under desired conditions, which may be varied for high-throughput testing. The patterned metallic islands provide a quick, reliable, consistent method to provide picoliter volumes or smaller solution droplets for the generation of supersaturated solutions resulting in the patterned crystallization of the solute with controlled size. Preferably, crystallization of organic and inorganic particles is constrained to the metallic island for ordered crystallization. The solution achieves supersaturation (low, modest or high, depending on the specific circumstances) via known techniques, such as, for illustrative purpose only, evaporation, vapor diffusion, antisolvent diffusion oil diffusion, and heating and cooling techniques.

One method for depositing solution droplets upon the metallic islands is by immersion of the substrate into a crystallite solution. As the monolayer on the metallic island preferentially binds the crystallite solution, droplets of the crystallite solution are formed on the metallic islands of the substrate by immersing and soaking the bifunctional substrate in the crystallite solution. Subsequently, the substrate is slowly withdrawn from the solution such that the solution droplets bind to the metallic islands. The solution drops with defined size and shapes are formed on the metallic islands when the patterned surface is immersed and slowly withdrawn from the solution. The droplets formed on the metallic islands will eventually crystallize.

The conditions for crystallization may be selected to promote a form or size of crystal. While the crystal size is in part controlled by the size of the droplet and the size of the metallic islands, the crystal form may be controlled by varying the rate of evaporation or other supersaturation technique, the incubation temperature, the concentration of droplet solution, and the chemical functionality of the SAMs. One of ordinary skill in the art can select and test conditions for producing a crystal of a desired form and size without undue experimentation. By modifying the characteristics of the droplet, it is possible to obtain a crystal of a desired form and size.

Preferably, the droplet solution contains both seeds (crystallized material) and solvent. The seeds are provided a starting point for nucleation and the solvent is for providing additional material for the crystal to grow. As the solution droplet contains seeds, the droplet need not undergo spontaneous crystallization, which in many instances can be rate limiting. As such, the time needed for crystallization is shorter.

Chemical, mechanical, and physical techniques (such as for example sonication and vibration) are suitable for removing the crystal from the metallic islands. In one embodiment, the crystal may be detached from the metallic islands by sonicating the crystallized substrate in an antisolvent. Also the crystals may be removed in dry powder form by placing a sonic probe on the back of the substrate and vibrating the surface rigorously to release the crystals. One of ordinary skill in the art may remove the crystals from the substrate using these and other conventional techniques.

Figure 9:
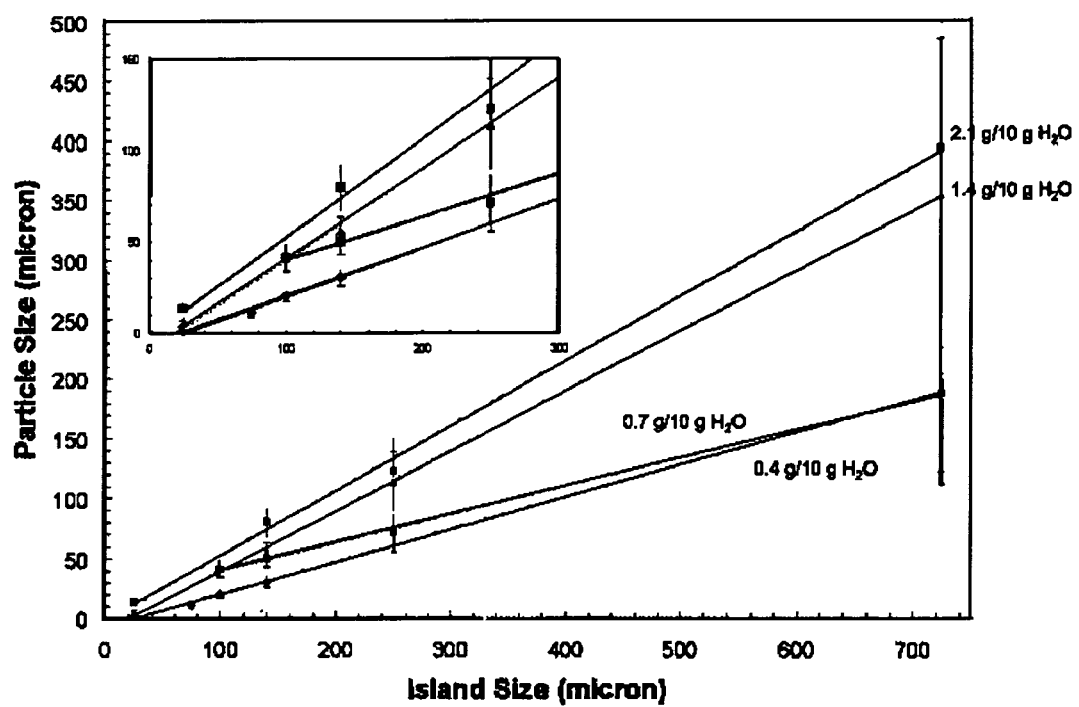
FIG. 9 is a graph showing the effect of island size and solution concentration on glycine crystal size.

The metallic island size and the solution concentration also can affect the crystal size. FIG. 9 is a graph showing the effect of island size and solution concentration on the crystal size of glycine crystals. As can be seen in FIG. 9, the metallic island size has a direct correlation to the final crystal size, with larger metallic islands resulting in larger crystals. Further, as also can be seen in FIG. 9, the solution concentration also has a direct correlation to the final crystal size, with solutions having greater concentrations of the crystallization material resulting in larger crystals. Thus, by manipulating the metallic island size and/or the solution concentration, larger or smaller crystals can be produced on the metallic islands.

However, as disclosed in more detain in the next section, the crystals may be analyzed with or without the removal of the crystals from the substrate. The size, morphology, and crystal form may be identified or analyzed by optical, electronic, and Raman microscopy. Other analytic techniques such as single crystal and powder x-ray diffraction, particle analyzers, and thermal analysis may be used to identify the crystalline forms on the metallic islands as well.

3. Screening the Crystals

Once the crystals are formed, the crystals can be characterized or otherwise screened by known techniques, such as Raman microscopy, without removing the crystals from the metallic islands. By providing for the nucleation and growth of the crystals and the screening of the crystals, all on the metallic islands, the present invention is a highly efficient method of screening crystals using the small distinct metallic islands without having to handle the crystals any more than is necessary or desired.

In terms of polymorph screening, the bulk solution from which the solution droplets emanate may contain various forms of a crystal, such as a stable $\alpha$-polymorph and a metastable $\beta$-polymorph. Metastable forms have a tendency to change quickly to the more stable form. In the present invention, the crystals are grown on a solid, namely, the distinct metallic islands. As a result, crystals of the metastable polymorph can grow on the distinct metallic islands, resulting in the production of more and better metastable (or other) polymorphs. The growth of the crystals on the solid metallic islands helps to prevent the conversion of the metastable crystals to the more stable crystals as solid state conversion is less likely to occur than liquid state conversion.

High throughput screening methods are known and are suitable for use in the present invention. For example, the use of a rectangular array of individual samples to be screened in combination with mechanisms for manipulating the rectangular array are well known. A first illustrative screening method is for the rectangular array to remain motionless and for a screening device to be moved so as to impinge sequentially upon each distinct metallic island. A second illustrative screening method is for the screening device to remain motionless and for the rectangular array to be moved such that the screening device sequentially impinges upon each distinct metallic island. Other such high throughput screening methds are known and are suitable for the present invention, including, for example, screening methods that are non-sequential or screen more than one sample at once.

More specifically, each array of metallic islands can be handled as a discrete screening entity without having to remove the individual crystals from the individual metallic islands. The substrate with the array of metallic islands can be mounted on a device for screening by, for example, a Raman microscopy device. In this manner, the Raman microscopy device can be programmed to examine the crystals on each metallic island in the same known manners that such a device can be programmed to examine a sequential array of hanging drops, a sequential array of vessels such as cuvettes, pipettes or test tubes, or a micro-well array of individual micro-wells.

EXAMPLES

1. Glycine Crystals.

Glycine was selected as an illustrative compound as it is the simplest amino acid and is known to provide a base for extrapolation to other amino acids, proteins and the like. For example, those of ordinary skill in the art recognize that the results of experimentation with glycine are applicable and can be extrapolated to other amino acids, proteins, and the like. If a method is successful with glycine, it is assumable that the method will be successful with other amino acids, proteins and the like.

Glycine was crystallized on a patterned bifunctional glass substrate (slide) with gold islands. The gold islands were prepared using various meshes with openings ranging from 25 microns to 725 microns. After the metallic islands were prepared, carboxyl-terminated SAMs were formed on the gold islands and methyl-terminated SAMs, octadecylrichlorosilane (OTS) were deposited to the area surrounding the gold islands.

Figure 5:
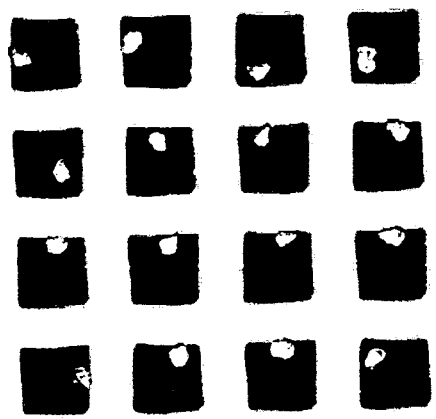
FIG. 5 is image of glycine crystal gown on two different sizes of gold metallic islands.
Figure 5:

An undersaturated solution of glycine, prepared in a 7:100 ratio, was deposited upon the gold islands. The glycine solution was deposited on the slide by immersing the slide in the glycine solution so that droplets of solution were produced on the gold islands. As shown in FIG. 5, a uniform array of glycine crystals nucleated and crystallized on the gold islands after the solution droplets on the gold island were evaporated at room temperature. The position of the crystals was dependent on the direction and orientation of the substrate when it is withdrawn from the solution. Further, the size of the crystal was dependent on the size of the metallic islands.

As shown in Table 1, the size of glycine crystals grown on various gold islands varies with metallic island size. Specifically, the data in Table 1 shows that the size and density of the glycine crystals were related to the size of the metallic islands.

TABLE 1

| No. | Island Size (microns) | Number of Islands on Glass Slides (2 cm × 1 cm) | Crystal Size Range (microns) | Mass per Surface Area (mg/cm$^2$) |
| --- | --- | --- | --- | --- |
| 1 | 725 | 200 | 200-290 | 13.64-31.23 |
| 2 | 130 | 5000 | 40-50 | 2.55-498 |
| 3 | 100 | 9800 | 20-30 | 0.54-1.82 |
| 4 | 75 | 16200 | 15-20 | 0.40-1.82 |
| 3 | 30 | 80000 | 5-10 | 0.093-.75 |

2. Mefenamic Acid (Form II) Crystals

A high dose of non-steroidal anti-inflammatory analgesic agent, mefenamic acid (form II), was crystallized on a patterned bifunctional glass substrate (slide) with gold islands. This difficult to crystallize drug was crystallized from undersaturated solutions of N,N-Dimethylformamide (DMF) (2.5 grams of mefenamic acid per 100 grams of DMF and 3.75 grams of mefenamic acid per 100 grams of DMF). Droplets of the solutions were placed by immersion on the gold islands, having a monolayer of carboxyl terminated SAMs with methyl-terminated (OTS) attached on the glass substrate. Specifically, solution droplets were formed after immersion and removal of the bi-functional surface from the respective solutions. Patterned crystallization occurred after the solvent was evaporated at room temperature.

Figure 6:
FIG. 6 is images of the mefenamic acid crystal grown on two different sizes of metallic islands.
Figure 6:
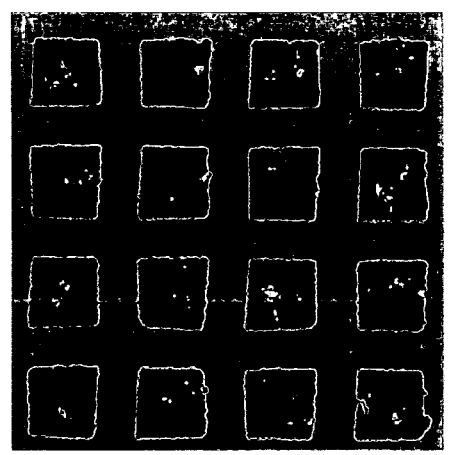

As shown in FIG. 6, mefenamic acid crystals (in the range of 25 to 40 microns) were grown on the metallic islands. The sizes of the crystals were analyzed using Raman microscopy and the analysis revealed that the crystalline form was the metastable modification (Form II), which is expected form when grown from DMF solution as reported previously.

3. Polymorphs of Glycine Crystals

A reduction in the evaporation rate of the droplet solution promoted one crystal form over another. A bi-functional substrate was prepared following the procedure of described in Example 1 and solution droplets were prepared that had a reduced rate of evaporation. Specifically, the addition of glycerol to the solution (7 grams of glycine per 95 grams of water and 5 grams of glycerol) reduces the evaporation rate as the solution is more viscous and less readily to evaporate if compared to an aqueous solution. The bifunctional substrate was immersed in the droplet solution and withdrawn from the solution so that droplets formed on the metallic islands. Crystallization occurred on the metallic islands after evaporation at room temperature and the crystal was analyzed using Roman spectroscopy.

Figure 7:
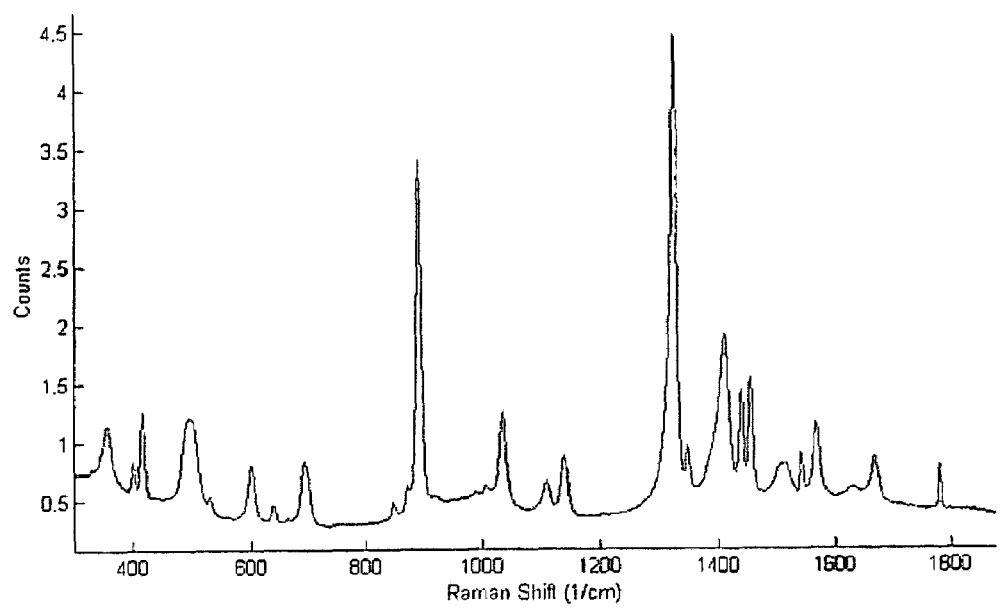
FIG. 7 is a representative Roman Spectra of β-glycine.
Figure 8:
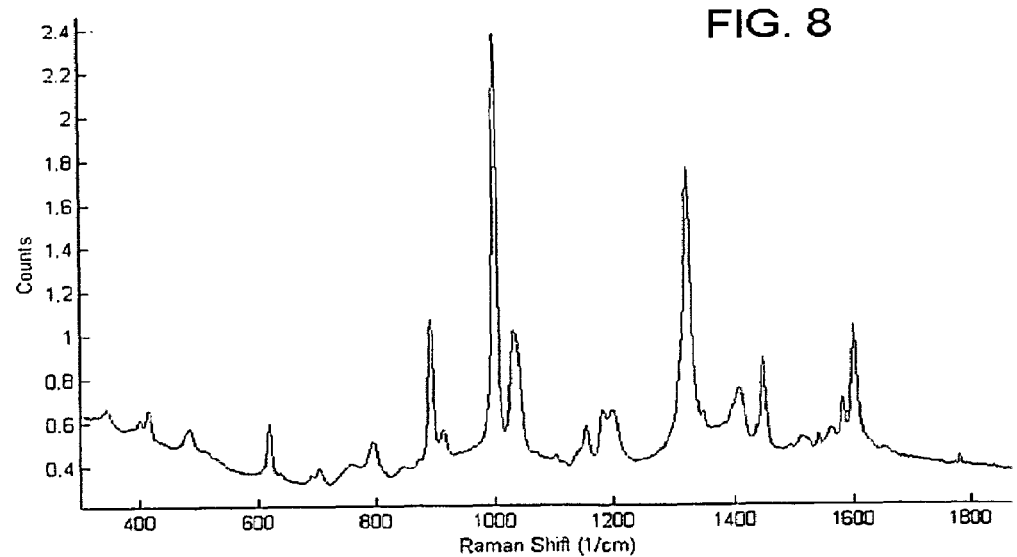
FIG. 8 is a representative Roman Spectra of α-glycine.

Raman spectroscopy, which uses characteristics of the vibrational mode of chemical compounds in the crystal lattice and can be used to determine and identify polymorphs, showed the glycine crystal grown had an unstable β-form polymorph. As shown in FIG. 7, Raman spectroscopy showed that the glycine crystals grown from the droplet solution with a fast evaporation rate of Example 1 were of the β-form that is crystallized typically in ethanol and water mixtures (see Iitaka, Y. Acta Crystallographica, 13, 35-45, 1960) or saturated aqueous solution of glycine containing acetic acid (see Drebushchak, T. N., Boldyreva and E. V., Shutova, E. S., ACTA Crystallographica E58, 0634-0636, 2002). This β-form glycine crystal was a different form from the α-form that crystallized under the reduced rate of evaporation conditions and has the Raman spectra shown in FIG. 8.

As can be seen from the foregoing disclosure and examples, the present invention presents a multi-fold method for producing crystals of interest. First, crystals of selected size can be produced by varying the solution concentration and/or the metallic island size. Second, metastable polymorphs, or polymorphs of lower stability that known or common polymorphs, can be produced due to the solid state nature of the crystallization process occurring on the metallic islands. Third, the sheer number of crystals that can be produced using an array of metallic islands on a substrate is greater, resulting in a more efficient and useful crystal condition screening method. Fourth, the combination of two or more of the preceding three factors provides an enhanced method for producing crystals of interest and uniformity for further research.

The foregoing detailed description of the preferred embodiments and the appended figures have been presented only for illustrative and descriptive purposes. They are not intended to be exhaustive and are not intended to limit the scope and spirit of the invention. The embodiments were selected and described to best explain the principles of the invention and its practical applications. One skilled in the art will recognize that many variations can be made to the invention disclosed in this specification without departing from the scope and spirit of the invention.

What is claimed is:

1. A method for the screening of crystallization conditions comprising the steps of:
    a) nucleating and growing crystals of a selected substance on functionalized metallic islands on a substrate, wherein the preparation of the crystals is accomplished in a micro-scale, high throughput manner comprising the steps of:
  i) preparing a bifunctional substrate with the metallic islands and multiple layers of self-assembled monolayers (SAMs) having desired chemical functional groups, and
  ii) preparing the crystals from solution droplets on the metallic islands on the substrate; and
b) after the crystals have formed on the metallic islands, analyzing the crystals,
wherein the metallic islands are prepared so that solution droplets preferentially wet the metallic islands, and
wherein the bifunctional substrate is prepared by a method comprising the steps of (a) depositing a metal adlayer onto the substrate to promote adhesion between the metal layer and substrate; (b) depositing a metal layer onto a surface of the substrate using a metal evaporation process so to create the metallic islands of the deposited metal; (c) depositing a first layer of the self-assembled monolayer (SAMs) with the a desired chemical functional group onto the metallic islands; and (d) depositing a second layer of the SAMs with another chemical functional group for use as backfill substrate onto the metallic islands.

2. The method as claimed in claim 1, wherein the metal suitable for use as the metal layer is selected from the group consisting of gold, silver titanium, platinum, nickel, copper, palladium, and combinations thereof.

3. The method as claimed in claim 2, wherein the metal adlayer is selected from the group consisting of titanium and chromium, which are deposited onto the substrate using an electron beam evaporator.

4. The method as claimed in claim 1, wherein the method for depositing the metal layer onto the substrate incorporates a means selected from the group consisting of a mesh and a photoresist polymer.

5. The method as claimed in claim 1, wherein once the metallic islands have been revealed on the substrate, a multiple layer pattern is deposited on the substrate by subsequent immersions in surfactant materials.

6. The method as claimed in claim 5, wherein the substrate is first immersed into a first surfactant material so to create a homogeneous self-assembled monolayer with a specific chemical functional head group formed on the metallic islands.

7. The method as claimed in claim 6, wherein subsequently the substrate is soaked in a second surfactant material so to provide the back fill-in for the metallic islands.

8. The method as claimed in claim 7 wherein the first surfactant preferentially binds to the metallic islands of the substrate.

9. A method for the screening of crystallization conditions comprising the steps of first nucleating and growing crystals of a selected substance on functionalized metallic islands on a substrate and then after the crystals have formed on the metallic islands, analyzing the crystals without removing the crystals from the metallic islands, wherein:
  a) supersaturated solution droplets containing the selected substance and having a defined size and shape are formed on the metallic islands by immersing the metallic islands into a solution bath containing the selected substance and withdrawing the metallic islands from the solution bath, wherein the solution bath contains an unsaturated, saturated or supersaturated solution of the selected substance; and
  b) the metallic islands are formed using self-assembled monolayers (SAMs) comprising at least one functional group and the functional group is selected to create a preferential bond between the metallic island and the solution droplets,
wherein the substrate is prepared by a method comprising the steps of (a) depositing a metal adlayer onto the substrate to promote adhesion between the metal layer and substrate; (b) depositing a metal layer onto a surface of the substrate so to create the metallic islands of the deposited metal; (c) depositing a first layer of the self-assembled monolayer (SAMs) with the a desired chemical functional group onto the metallic islands; and (d) depositing a second layer of the SAMs with another chemical functional group for use as backfill substrate onto the metallic islands,
wherein the metal for use as the metal layer is selected from the group consisting of gold, silver titanium, platinum, nickel, copper, palladium, and combinations thereof.

10. The method as claimed in claim 9, wherein the metal adlayer is selected from the group consisting of titanium and chromium, which are deposited onto the substrate using an electron beam evaporator.

11. The method as claimed in claim 9, wherein the method for depositing the metal layer onto the substrate incorporates a means selected from the group consisting of a mesh and a photoresist polymer.

12. The method as claimed in claim 11, wherein once the metallic islands have been revealed on the substrate, a multiple layer pattern is deposited on the substrate by subsequent immersions in surfactant materials.

13. The method as claimed in claim 9, wherein the substrate is first immersed into a first surfactant material so to create a homogeneous self-assembled monolayer with a specific chemical functional head group formed on the metallic islands, and then the substrate is soaked in a second surfactant material so to provide the back fill-in for the metallic islands,
  wherein the first surfactant preferentially binds to the metallic islands of the substrate.

14. The method as claimed in claim 9, wherein the crystal is prepared on the metallic islands from solution droplets under a set of defined parameters selected from the group consisting of the size of the metallic island, the structure of the metallic island, and the solution concentration.

15. The method as claimed in claim 9, wherein the conditions for crystallization are selected to promote a specific form or size of crystal.

16. The method as claimed in claim 9, wherein the crystal form is controlled by a chemical process selected from the group consisting of varying the rate of supersaturation, varying incubation temperature, varying the concentration of droplet solution, and varying the chemical functionality of the SAMs.

17. The method as claimed in claim 9, wherein the solution droplets contain both seeds crystallized material and solvent so to improve crystallization rates.

18. The method as claimed in claim 9, wherein the size, morphology, and crystal form is analyzed by a techniques selected from the group consisting of optical microscopy, electronic microscopy, Raman microscopy, single crystal x-ray diffraction, powder x-ray diffraction, particle analyzers, and thermal analysis.

19. The method as claimed in claim 9, wherein from 200 to 80,000 metallic islands are contained on a single substrate.

20. The method as claimed in claim 9, wherein at least one of the multiple layers comprises a silane and a functional group.

21. The method as claimed in claim 9, wherein at least one of the multiple layers comprises thiols and has a functional group.

22. The method as claimed in claim 9, wherein the functional group is selected from the group consisting of carboxyl, hydroxyl (OH), nitro ($NO_2$), sulfonic acid ($SO_3^-$), and phosphonic acid ($-PO_4^-$).

23. The method as claimed in claim 9, wherein the functional group is selected from the group consisting of methyl ($CH_3$), trifluoromethyl ($CF_3$), halogenated fluorine, halogenated chlorine, halogenated bromine, and halogenated iodine.

24. The method as claimed in claim 9, wherein the method is carried out at a constant room temperature.

* * * * *

UNITED STATES PATENT AND TRADEMARK OFFICE
CERTIFICATE OF CORRECTION

PATENT NO. : 7,329,319 B2
APPLICATION NO. : 10/985307
DATED : February 12, 2008
INVENTOR(S) : Allan S. Myerson and Alfred Y. Lee It is certified that error appears in the above-identified patent and that said Letters Patent is hereby corrected as shown below:

In the Specifications:

At column 1, line 4, between the Title and the BACKGROUND OF THE INVENTION section, insert as a separate section:

--STATEMENT OF GOVERNMENT INTEREST

This invention was made with Government support under contract number N00173-06-1-G007 that was awarded by the Naval Research Laboratory. The Government has certain rights in the invention.--

Signed and Sealed this
Seventh Day of May, 2013

Teresa Stanek Rea
*Acting Director of the United States Patent and Trademark Office*